(12) United States Patent
Golla et al.

(10) Patent No.: US 7,778,105 B2
(45) Date of Patent: Aug. 17, 2010

(54) MEMORY WITH WRITE PORT CONFIGURED FOR DOUBLE PUMP WRITE

(75) Inventors: Robert T. Golla, Round Rock, TX (US); Xiang Shan Li, Austin, TX (US)

(73) Assignee: Oracle America, Inc., Redwood Shores, CA (US)

( * ) Notice: Subject to any disclaimer, the term of this patent is extended or adjusted under 35 U.S.C. 154(b) by 215 days.

(21) Appl. No.: 12/049,798

(22) Filed: Mar. 17, 2008

(65) Prior Publication Data

US 2009/0231935 A1    Sep. 17, 2009

(51) Int. Cl.
*G11C 7/00* (2006.01)
*G11C 8/00* (2006.01)

(52) U.S. Cl. ............ 365/230.05; 365/189.05; 365/230.08; 365/233.1; 365/233.5

(58) Field of Classification Search ............ 365/230.05, 365/233.1, 233.13, 233.16, 233.17, 233.19, 365/194, 189.05, 230.08, 233.5
See application file for complete search history.

(56) References Cited

U.S. PATENT DOCUMENTS

| | | | | |
|---|---|---|---|---|
| 4,610,004 A | * | 9/1986 | Moller et al. ......... | 365/230.05 |
| 5,612,923 A | * | 3/1997 | Gibson et al. ......... | 365/230.05 |
| 5,629,901 A | * | 5/1997 | Ho ........................ | 365/230.05 |
| 5,941,979 A | | 8/1999 | Lentz et al. | |
| 6,240,038 B1 | * | 5/2001 | Barry et al. ............ | 365/230.05 |
| 6,934,780 B2 | | 8/2005 | Modelski et al. | |
| 7,277,353 B2 | * | 10/2007 | Goel .................... | 365/230.05 |
| 7,564,738 B2 | * | 7/2009 | Pelley et al. .......... | 365/230.05 |

* cited by examiner

*Primary Examiner*—Trong Phan
(74) *Attorney, Agent, or Firm*—Meyertons, Hood, Kivlin, Kowert & Goetzel, P.C.; Erik A. Heter

(57) ABSTRACT

A memory with a write port configured for double-pump writes. The memory includes a first and second memory locations each having one or more bit cells, and one or more bit lines each coupled to corresponding ones of the bit cells. A write port is coupled to each of the bit lines. Selection circuitry, responsive to a first clock edge, latches first data from a first data path through the write port, and responsive to a second clock edge, latches second data from a second data path through the write port. A first pulse is generated during a first phase of the clock signal to cause writing of the first data into the first memory location. A second pulse is generated during a second phase of the clock signal to cause writing of the second data into the second memory location.

7 Claims, 5 Drawing Sheets

MEMORY WITH WRITE PORT CONFIGURED FOR DOUBLE PUMP WRITE

BACKGROUND OF THE INVENTION

1. Field of the Invention

This invention relates to memories, and more particularly, to the act of writing information to a memory.

2. Description of the Related Art

Computer systems utilize varying types of memory within a memory hierarchy to store data needed to conduct operations. Various types of memory can be separated into a hierarchy, with hard disk drives at the lower end of the hierarchy, main memory (typically dynamic random access memory, or DRAM) somewhere in the middle, cache memories near the top, and registers at the very top. Each of these various types of memory provides varying levels of speed. For example, hard disk drives, typically used for long term storage, have the slowest access times. At the other end of the spectrum, registers, which provide temporary storage of data during the execution of instructions, require very fast access times for both reads and writes.

The various types of memory on the access hierarchy have different mechanisms for reading and writing. For example, some memories that do not require fast access times may have only a single access port, through which data can be written to or read from the memory. Other memories that require fast access times, such as register files, may include a number of different read and write ports. This is particularly true for register files implemented in pipelined microprocessors, superscalar microprocessors, and combinations thereof, where multiple reads and writes may be required with each machine cycle. Since, in many embodiments, the requirement for the number of reads and writes per machine cycle drives the number of required read and write ports, achieving higher performance in processor in particular (and a computer system in general) may result in the need for greater numbers of both.

SUMMARY OF THE INVENTION

A memory and a method of writing to the memory are disclosed. In one embodiment, a memory includes a first memory location having one or more bit cells, a second memory location having one or more bit cells, and one or more bit lines, each of the one or more bit lines coupled to a corresponding one of the one or more bit cells of the first memory location and a corresponding one of the one or more bit cells of the second memory location. The memory also includes a write data port coupled to each of the one or more bit lines, and further coupled to a first data path and a second data path. Selection circuitry is configured to at a first edge of a clock signal, latch first data received from a first data path through the write data port and onto the bit lines, and at a second edge of the clock signal, latch second data received from a second data path through the write data port and onto the bit lines. A first word circuit is configured to generate a first pulse subsequent to the first edge and during a first phase of the clock signal, thereby causing the first data to be written into the first memory location, and a second word circuit is configured to generate a second pulse subsequent to the second edge and during a second phase of the clock signal, thereby causing the second data to be written into the second memory location.

In one embodiment, A method for writing to the memory includes, responsive to a first edge of clock signal, latching first data received from a first data path onto one or more bit lines each coupled between a write data port and a corresponding one of one or more bit cells of a first memory location, and subsequent to the first edge, and during a first phase of a cycle of the clock signal, providing a first pulse on a first word line coupled to each of the bit cells of the first memory location, thereby capturing the first data into the first memory location. The method further includes, responsive to a second edge of the clock cycle, latching second data received from a second data path onto the one or more bit lines, and subsequent to the second edge and during a second phase of the cycle of the clock signal, providing a second pulse on a second word line coupled to each of the bit cells of the second memory location, thereby capturing the second data into the second memory location.

A processor is also contemplated. The processor includes an arithmetic-logic unit and a register file. The processor may have an arrangement similar to an embodiment the memory described above, and function in accordance an embodiment of the method described above. The register file may include an array of memory locations arranged in rows, and a plurality of write data ports. Each of the write data ports is shared by register locations within a given row.

Broadly speaking, a memory is contemplated wherein the memory includes a plurality of write data ports, which are shared by pairs of memory locations. The memory is configured for double-pump writing, wherein, during a first phase of a clock cycle, data is written through a write data port to a first memory location, and during a second phase of the clock cycle, data is written through the same write data port to a second memory location. This may allow the reduction of the number of write data ports by half, while enabling multiple writes through a single write data port during a single clock cycle.

BRIEF DESCRIPTION OF THE DRAWINGS

Other aspects of the invention will become apparent upon reading the following detailed description and upon reference to the accompanying drawings in which.

Figure 1:
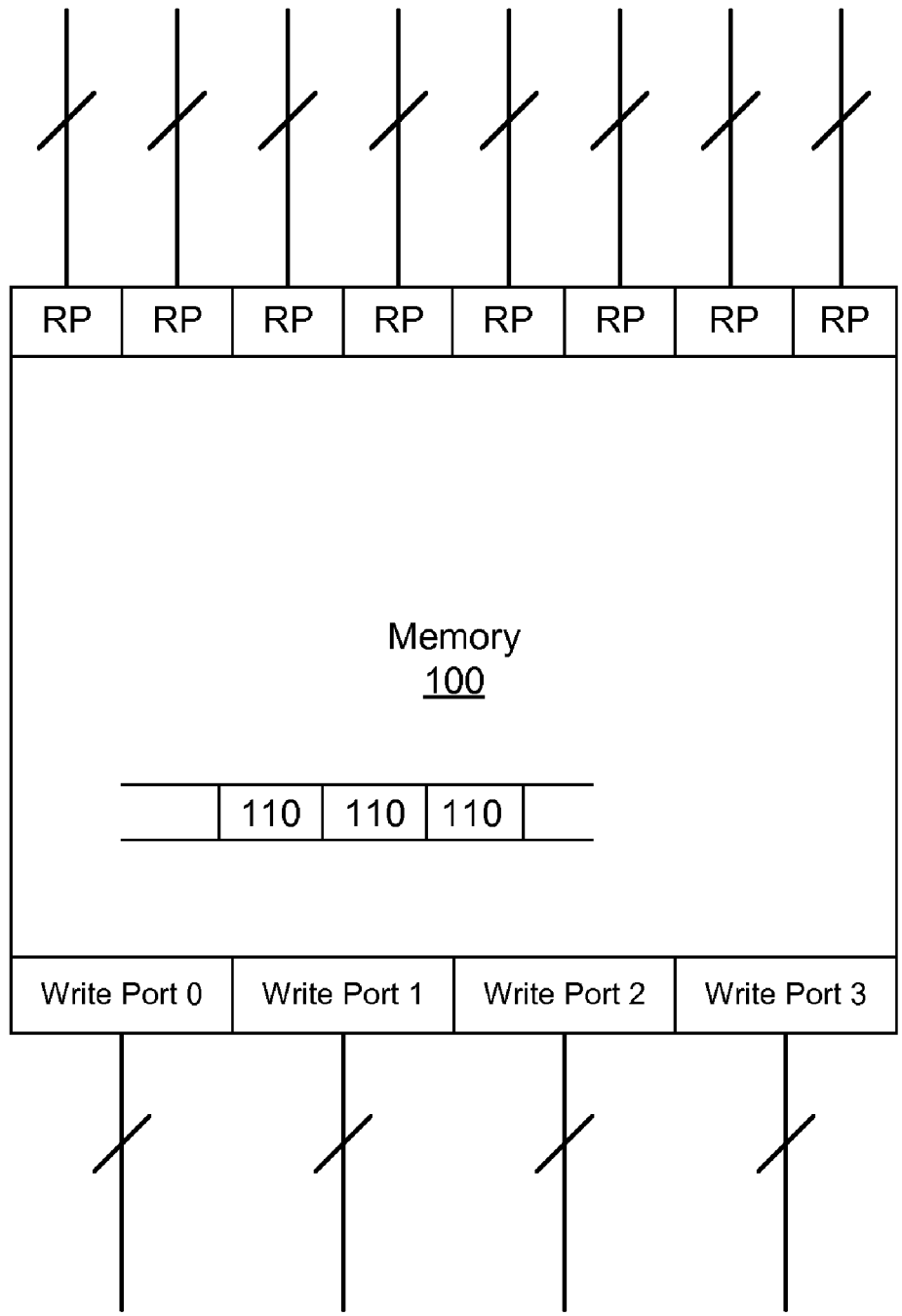
FIG. 1 is a drawing of one embodiment of a memory array including a plurality of memory locations and a plurality of write data ports.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling with the spirit and scope of the present invention as defined by the appended claims.

DETAILED DESCRIPTION OF THE INVENTION

Turning now to FIG. 1, a drawing of one embodiment of a memory array including a plurality of memory locations and a plurality of write data ports is shown. Memory array 100 may be one of several different types of memories, such as a dynamic random access memory (DRAM), a static random access memory (SRAM), and so forth. Memory array 100 may be used in various applications, such as in computer system main memory, register files, cache memories, and others. As will be discussed below, memory array 100 includes a plurality of read ports and write data ports that enable fast accesses and multiple writes in a given clock cycle.

In the embodiment shown, memory array 100 includes a plurality of memory locations 110, which are arranged in rows. For the sake of simplicity, only a few of memory locations 110 are shown and labeled. Each of memory locations 110 is configured to store one or more bits of information. Typical data sizes stored by memory locations include 8 bits, 16 bits, 32 bits, and so forth, although virtually any size may be selected for a particular embodiment. For each bit to be stored, a given memory location 110 includes a corresponding bit cell. Thus, a memory array having 8-bit memory locations includes 8 bit cells in each memory location. Each of the bit cells is coupled to a bit line on which data is conveyed to or from the bit cell. The bit cells of a given memory location 110 are each coupled to a common word line, which activates the memory location 110 for reading or writing. The circuit arrangement for bit lines and word lines of memory array 100 are discussed in further detail with respect to FIG. 2.

Each memory location 110 may be associated with an address unique to that memory location. Addresses may be selected for reading or writing by an address decoder which is coupled to select addresses for read and write operations. The address decoder is not shown here for the sake of simplicity.

Memory array 100 includes a plurality of read ports (labeled 'RP') and write ports (labeled 'Write Port 0' to 'Write Port 3'). In the embodiment shown, a single read per clock cycle can be performed through each read port. However, the arrangement of the write ports is such that two writes per clock cycle can be conducted through each, as will be explained in further detail below.

It should be noted that memory array 100 is arranged such that a conflicting attempt to read from and write to the same memory location during the same clock cycle is prevented. Those skilled in the art of memory technologies will appreciate the various means by which memory locations can be enabled for reading from or writing to during a given clock cycle.

Figure 2:
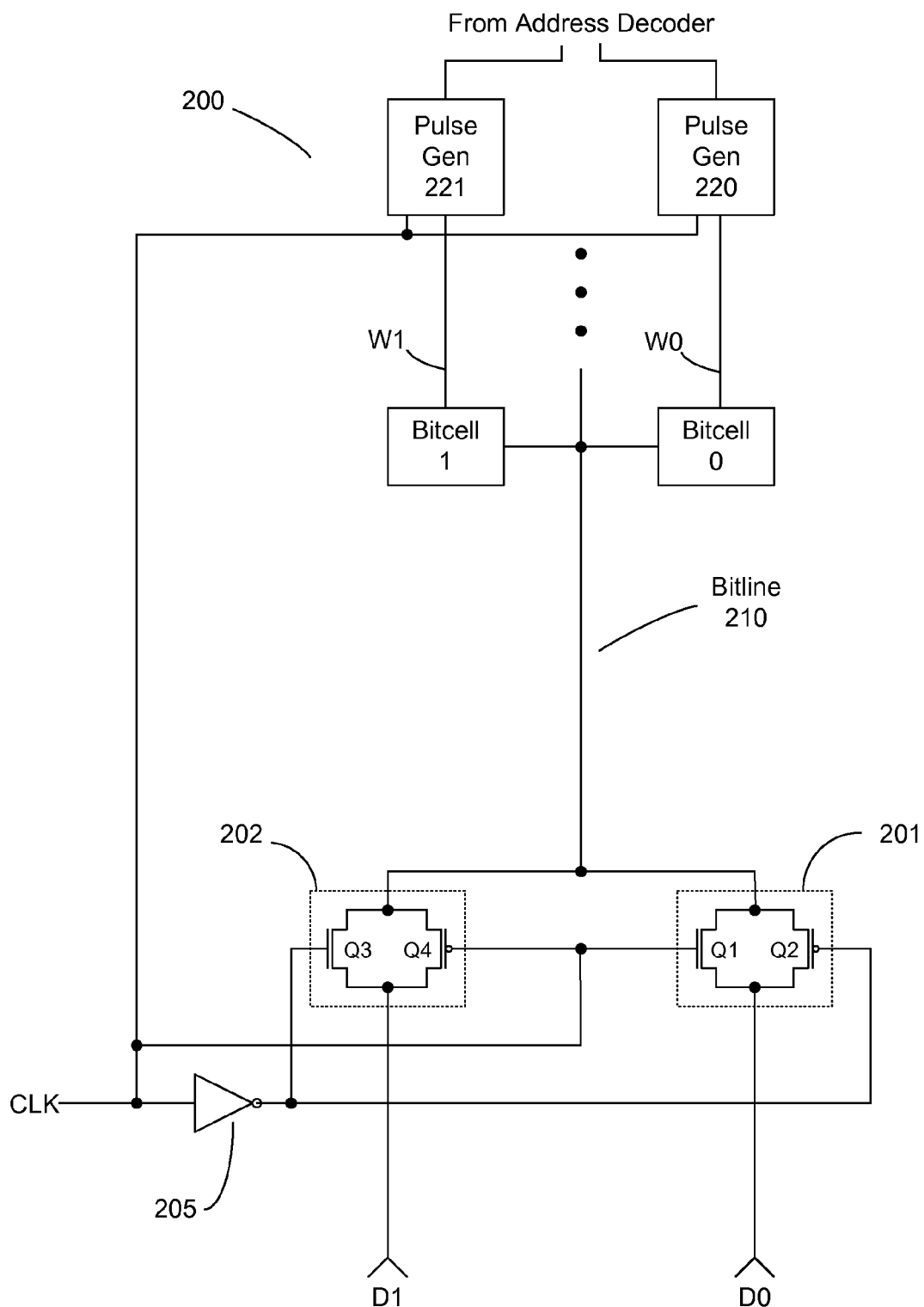
FIG. 2 is a schematic diagram of one embodiment of a circuit arrangement illustrating the coupling of a write data port to a plurality of bit cells by a common bit line.

FIG. 2 is a schematic diagram of one embodiment of a circuit arrangement illustrating the coupling of a write data port to a plurality of bit cells by a common bit line. In the embodiment shown, circuit 200 includes a first bit cell (bit cell 0) that is associated with a first memory location, and a second bit cell (bit cell 1) that is associated with a second memory location. Both of the bit cells are coupled to a common bit line 210. Other bit cells may also be coupled to bit line 210. Each of the bit cells is also coupled to a word line that is unique to that bit cell with respect to other bit cells coupled to the bit line 210. The configuration of bit cells 0 and 1 (and thus, other bit cells in the memory in which circuit 200 is implemented) may comprise back to back inverters or any other suitable bit cell structure that is well known in the art. In the embodiment shown, the bit cells are single-ended bit cells, as opposed to differential bit cells. Using single ended bit cells may reduce the area required by the memory array.

The circuit arrangement shown can be repeated any number of times necessary to form the memory locations of the memory in which it is implemented. For example, the circuit arrangement shown in FIG. 2 could be repeated eight times to form two 8-bit memory locations, wherein each two corresponding bit cells of the memory locations share the same one of eight bit lines. The write data port formed may be coupled to two 8-bit data paths that receive data externally from the memory.

In the embodiment shown, bit cell 0 is coupled to word line W0, while bit cell 1 is coupled to word line W1. When a word line signal is asserted for a given bit cell, the bit line becomes transparent to the bit cell. Thus, any data present on bit line 210 that is to be written to a bit cell may be propagated thereto when the bit cell's corresponding word line is activated. In the embodiment shown, only one word line can be activated at a given time for the bit cells that are coupled to bit line 210. The activation of the word lines may be controlled by their respective pulse generation circuits 220 or 221. These pulse generation circuits are coupled to receive the clock signal as well as a signal from an address decoder indicating that their respective memory locations are to be written to. Pulse generation circuits 220 and 221 are coupled to provide a pulse to each of the bit cells of a given memory location. Each of the pulse generation circuits 220 and 221 is coupled to receive the clock signal, as well as the signal from the address decoder, and generate their respective pulses based on these signals.

Circuit 200 is coupled to receive a clock signal, which, on a first phase, enables first data (D0) to be transparent to bit line 210, and on a second phase, enables second data (D1) to be transparent to bit line 210. In this particular arrangement, the clock signal is high during the first clock phase. The clock signal is received at the input of inverter 205, as well as directly on the gate terminals of transistors Q1 and Q4. Transistors Q1 and Q2 are coupled to form a first passgate 201, while transistors Q3 and Q4 are coupled to form a second passgate 202. The passgates form selection circuitry configured to latch data from D0 onto bit line 210 during a first phase of a clock cycle and to latch data from D1 onto bit line 210 during a second phase of the clock cycle.

For this particular embodiment, when the clock cycle is high, transistors Q1 and Q2 are turned on, thereby causing passgate 201 to be transparent to data present at the input D0. This data is then propagated onto bit line 210. At a point subsequent to the clock edge where the clock signal transitions high, a word line pulse may be asserted to bit cell 0, if data is to be written thereto. When the first pulse is asserted (i.e. transitions high) on word line W0, the data present on bit line 210 may propagate into and be captured by bit cell 0, thereby completing the write. After the first pulse has completed (i.e. falls low), the data on bit line 210 is no longer transparent to bit cell 0.

When the clock cycle transitions low, transistors Q1 and Q2 are turned off, while the transistors of passgate 202, Q3 and Q4, are turned on. When the transistors of passgate 202 are turned on, passgate 202 becomes transparent to data present at the input D1. This data can then propagate to bit line 210. At a point subsequent to the clock edge where the clock signal transitions low, a second pulse may be asserted on word line W1. When the second pulse is asserted (i.e. transitions high) on word line W1, the data present on bit line 210 may propagate into and be captured by bit cell 1, thereby completing the write thereto. After the second pulse has completed (i.e. falls low), the data on bit line 210 is no longer transparent to bit cell 1.

Thus, implementing a memory using the circuit arrangement shown in FIG. 2 to implement write data ports enables a single write data port to complete two writes within a single clock cycle, instead of requiring two of the same to enable the same capability. Thus, if desired two writes can be completed through a single write data port for two different memory locations each coupled to receive data through the same write data port. This enables faster operations by allowing more writes to the memory than an arrangement wherein only one write per clock cycle is possible for a given write data port. The circuit arrangement may also save area required by a memory, as bit lines via which data is written may be shared by two or more data ports. In addition, each bit cell itself requires fewer write ports, resulting in further area savings.

Figure 3:
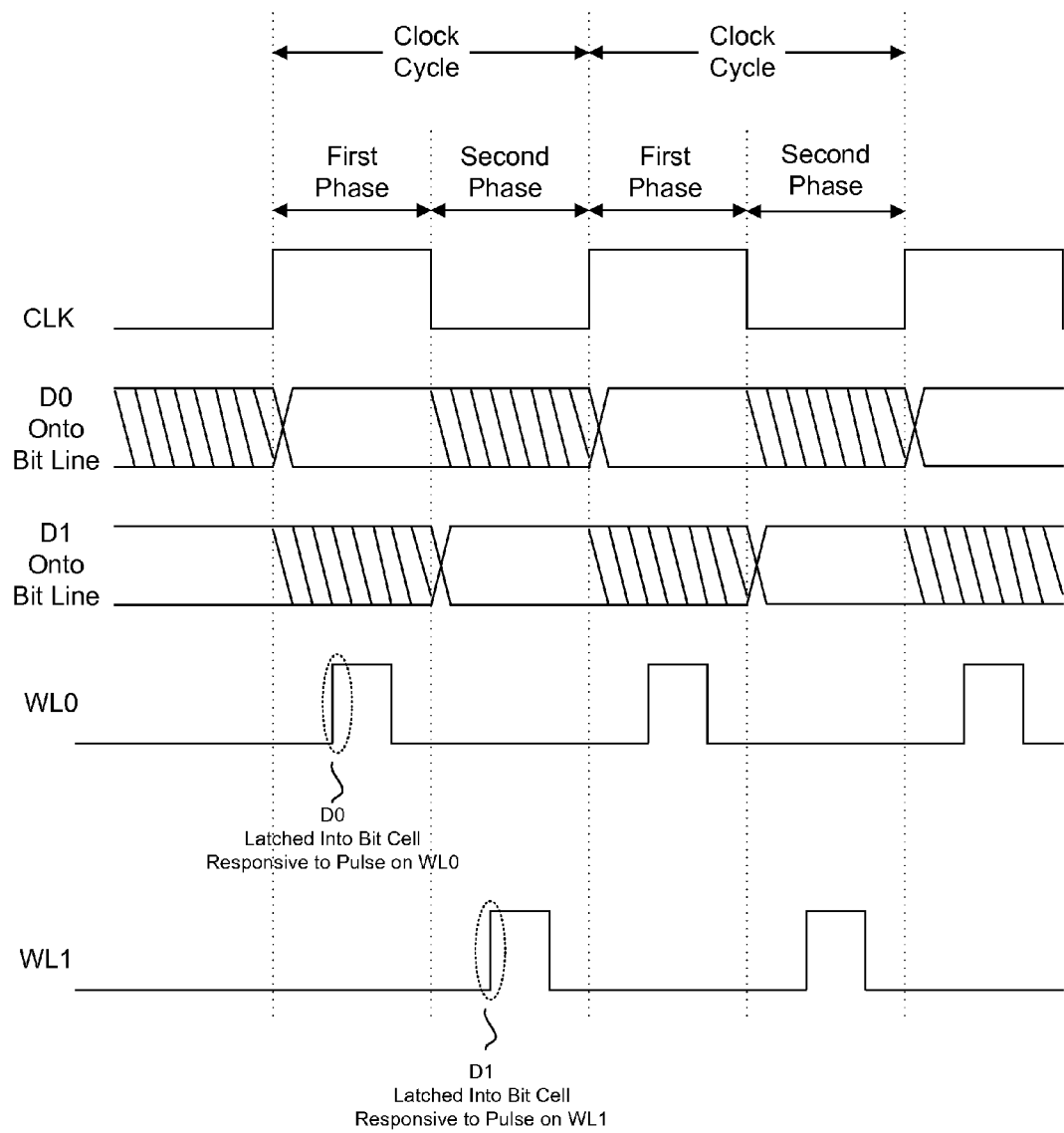
FIG. 3 is a timing diagram illustrating the operation of the circuit of FIG. 2.

Turning now to FIG. 3, a timing diagram illustrating the operation of the circuit of FIG. 2 is shown. At a first edge of a clock signal, wherein the clock signal transitions high, a first clock phase begins. First data D0 is driven onto a bit line responsive to the first edge of a clock cycle. Subsequent to the first edge of the clock cycle and during the first phase thereof, a pulse is provided on word line 0, or WL0 as labeled in the example shown. In this example, the pulse has a duration that is approximately one quarter of the duration of the entire clock cycle. In general, the duration of a pulse on a word line will be less than the duration of the phase in which it occurs, and may be varied within this range in order to ensure the necessary setup and hold times occur in order to capture the data. When the first word line pulse W0 is asserted, first data D0 is latched into the bit cell that received the pulse, as indicated in the diagram. After the first pulse has been asserted for sufficient duration to capture the data, it falls low.

At a second edge, the clock signal falls low, and the second phase of the clock cycle begins. Since the write port is shared in accordance the circuit arrangement shown in FIG. 2, data present on the signal line corresponding to data D0 is blocked from the bit line by the switching off of the corresponding pass gates in the second (low) phase of the clock cycle. This is indicated in the timing diagram by the diagonal lines for data D0, and it is noted that data D1 is similarly blocked from the bit line during the first (high) phase of the clock cycle.

The passgate coupled to the signal line carrying second data D1 is activated responsive to the clock edge at the beginning of the second phase of the clock cycle. At this point, second data D1 is latched onto the same bit line upon which the first data D0 was conveyed during the first phase of the clock cycle. Subsequent to the second edge of the clock cycle and during the second phase thereof, a second pulse W1 is provided to the word line of the corresponding destination bit cell. Similar to the pulse provided in the first phase, the duration of the second pulse W1 is less than the duration of the second phase, and in this case, approximately one-quarter of a clock cycle. Upon assertion of the second pulse, second data D1 is captured into the bit cells that receive the pulse, as indicated by the transition of D1 shown in the timing diagram. After the second pulse has been asserted for sufficient duration to capture the data, it falls low.

The cycle outlined in the previous two paragraphs and illustrated by the timing diagram of FIG. 3 may repeat itself for each clock cycle, assuming writes are to be conducted to the cells coupled to the corresponding write data port. If no writes are to be conducted to one of the bit cells coupled to the write data port during a given clock cycle, the corresponding word line pulses are inhibited for that clock cycle.

It is noted that the clock cycle, generally speaking, has a 50% duty cycle (i.e. is high for substantially the same duration it is low). It is also noted that the particular point in time within the clock cycle with word line pulses occur may vary according to the design requirements of the circuit.

Generally speaking, a method for conducting two writes through a single write data port in a single clock cycle can be described as follows. Responsive to a first edge of a clock signal, first data received from a first data path is latched onto one or more bit lines each coupled between a write data port and a corresponding one or more bit cells of a first memory location. Each bit line is also coupled between the write data port and corresponding bit cells of a second memory location, i.e. the bit lines are shared between corresponding cells of the first and second memory locations.

Subsequent to the first edge of the clock signal, but during the first phase thereof, a first pulse is provided on a first word line that is coupled to each of the bit cells of the first memory location. This causes the data on the bit lines to be captured into the bit cells of the first memory location. The duration of the pulse is less than the length of the first phase of the clock signal, and ends before the first phase ends.

Responsive to a second edge of the clock cycle (i.e. at the beginning of the second phase thereof), second data received from a second data path is latched onto the same bit lines, while the first data is blocked therefrom. Subsequent to the second edge and during the second phase, a second pulse is provided on a second word line coupled to each of the bit cells of the second memory location. Providing the second pulse causes data on the bit lines to be captured into the bit cells of the second memory location.

Figure 4:
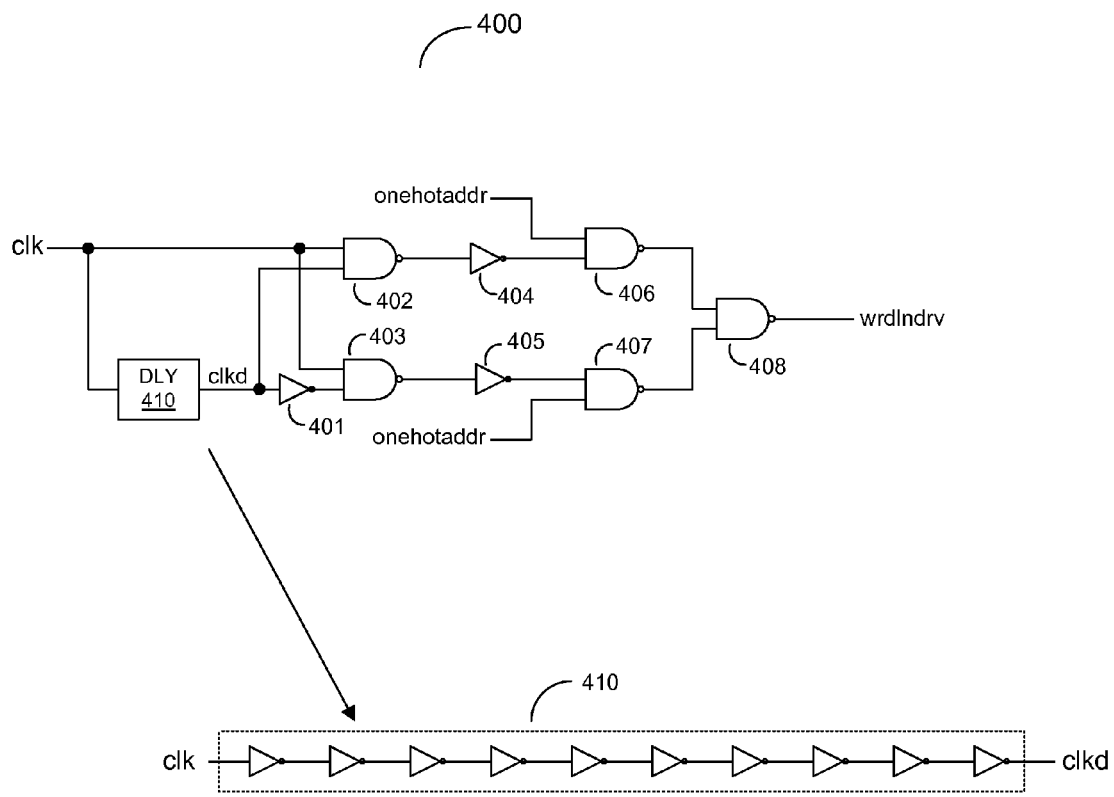
FIG. 4 is a logic diagram of one embodiment of a circuit configured to generate a word line pulse.

FIG. 4 is a logic diagram of one embodiment of a circuit configured to generate a word line pulse. In the embodiment shown, circuit 400 is a logic circuit that may be used to implement a word line circuit, such as one of the pulse generating circuits 220 or 221 of FIG. 2. Circuit 400 is coupled to receive as inputs a clock signal (clk) and an address signal (onehotaddr). The clock signal is received as an input to NAND gates 402 and 403, as well as an input to delay circuit 410. In the embodiment shown, delay circuit includes a plurality of serially coupled inverters that delay the clock signal by introducing propagation delay. In other embodiments, non-inverting buffers or other types of delay elements can be used. Delay circuit 410 is coupled to provide a delayed output clock signal, clkd, to the input of inverter 401 and one of the inputs of NAND gate 402.

The clock and delayed clock signals are logically combined in the gates of circuit 400, along with the address signals when the corresponding word line is to be written to. Inverters 404 and 405 are coupled between the outputs of NAND gates 402 and 403, respectively, and inputs to NAND gates 406 and 407, respectively, in the embodiment shown. Due to the timing of the signals provided the outputs from NAND gates 406 and 407 will usually be a logic 1 for both gates, thereby causing the output of NAND gate 408 to be a logic 0. When the memory location corresponding to circuit 400 is selected for a write operation, the outputs of one or both of NAND gates 406 and 407 will fall low at some portion during the clock cycle, causing the output of NAND gate 408 ('wrdlndrv') to transition high and thus generating the pulse conveyed on the word line. Circuit 400 is configured such that the relative timing of the various input signals are in a combination to produce the output pulse for a duration that is less than that of one phase of the clock cycle.

It is noted that other types of pulse generating circuits may be used to generate the required word line pulses.

Figure 5:
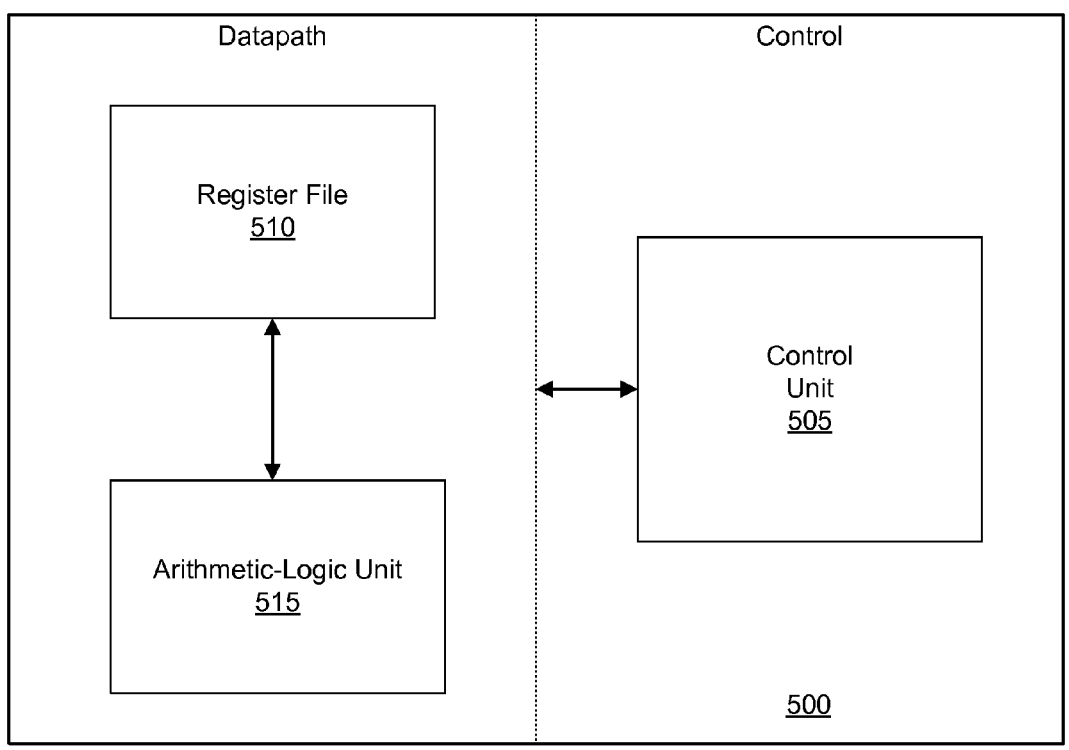
FIG. 5 is a block diagram of a processor including a register file having multiple write data ports.

Turning now to FIG. 5, a block diagram of a processor including a register file having multiple write data ports is shown. In the embodiment shown, processor 500 includes a data path and a control section. The data path includes register file 510 and arithmetic-logic unit (ALU) 515, while the control section includes control unit 505. The control unit 505 is uses to perform various functions such as effecting register transfers, interpreting instructions, and so on. ALU 515 is configured to perform various arithmetic functions (addition, subtraction, etc.) as well as logic functions (AND, OR, etc.). Register file 510 is configured to store both operands upon which arithmetic and logic functions are performed, as well as storing results from the arithmetic and logic functions.

Processor 500 may be a high-speed processor that incorporates various techniques such as multi-threading and pipelined execution. As such, multiple register accesses may be required during each clock cycle, wherein the register accesses may include multiple writes. In the embodiment shown, register file 510 is implemented using an SRAM memory array in accordance with those disclosed above. That is, register file 510 includes a plurality of write data ports that are shared and that are configured for two writes per clock cycle. The bit cells of the memory locations of register array are single-ended bit cells, and, in accordance with the configuration of the write data ports disclosed herein, the bit lines are shared between multiple bit cells. The use of a memory array having write data ports that allow two writes per a single clock cycle may enable the faster execution speeds needed to support multi-threading and/or an efficient use of pipeline resources.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. A method of writing to a memory, the method comprising:

responsive to a first edge of clock signal, latching first data received from a first data path onto one or more bit lines each coupled between a write data port and a corresponding one of one or more bit cells of a first memory location, wherein each of the one or more bit lines are further coupled between the write data port and a corresponding one of one or more bit cells of a second memory location;

subsequent to the first edge, and during a first phase of a cycle of the clock signal, providing a first pulse on a first word line coupled to each of the bit cells of the first memory location, thereby capturing the first data into the first memory location;

responsive to a second edge of the clock signal, latching second data received from a second data path onto the one or more bit lines; and subsequent to the second edge and during a second phase of the cycle of the clock signal, providing a second pulse on a second word line coupled to each of the bit cells of the second memory location, thereby capturing the second data into the second memory location.

2. The method as recited in claim 1, wherein the duration of the first pulse is less than the duration of the first phase of the clock signal, and wherein the duration of the second pulse is less than the duration of the second phase of the clock signal.

3. The method as recited in claim 2, wherein the duration of the first pulse and the length of the second pulse each have a duration of approximately one quarter of a cycle of the clock signal.

4. The method as recited in claim 2, wherein the first pulse and the second pulse are generated using the clock signal.

5. The method as recited in claim 1, wherein each of the one or more bit cells of the first memory location and the one or more bit cells of the second memory location are single-ended bit cells.

6. The method as recited in claim 1, wherein the clock signal is high during one of the first phase or the second phase, and wherein the clock signal is low during the other one of the first phase or the second phase.

7. The method as recited in claim 6, wherein one of the first edge or the second edge is a rising edge, and wherein the other one of the first edge or the second edge is a falling edge.

* * * * *